Nov. 21, 1961 R. E. HEATH ET AL 3,010,052

TIERED ELECTRONIC PACKAGE

Filed Dec. 31, 1958 2 Sheets-Sheet 1

INVENTORS
ROBERT E. HEATH
WALTER M. YOUNG

BY James T. Comfort
ATTORNEY

United States Patent Office 3,010,052

Patented Nov. 21, 1961

3,010,052

TIERED ELECTRONIC PACKAGE

Robert E. Heath and Walter M. Young, Poughkeepsie, N.Y., assignors to International Business Machines Corporation, New York, N.Y., a corporation of New York Filed Dec. 31, 1958, Ser. No. 784,354
1 Claim. (Cl. 317—101)

This invention relates to the packaging of electronic components and more particularly to an improved pluggable unit which will accommodate heat sensitive and heat producing components yet isolate the heat sensitive from the heat producing components while maintaining maximum component density and relatively short circuit leads connecting the components.

The electronic components used in present electronic machines have a long useful life but they must ultimately be replaced. The down time (when a machine is being repaired) is expensive and must therefore be kept to an absolute minimum by rapidly replacing the faulty components. Replacement is accomplished fastest by locating the circuit in which the faulty component is located and replacing the whole circuit allowing the machine itself to resume operation. A package should therefore be able to accommodate all of the ordinary components which will be used in electronic circuits.

Present day solid state electronic components such as transistors and diodes are relatively small in comparison with such electronic components as vacuum tubes. The pluggable units containing such solid state components should also be smaller than the prior pluggable units which used vacuum tubes. However, solid state components are sensitive to heat and must be isolated and protected from the heat producing components. Such isolation has made it difficult to construct a small pluggable unit using solid state components.

Electronic machines such as computers operate at extremely high speeds and long circuit connections between components hinder such high speeds. The isolation of heat sensitive components in the past has for the most part required long circuit leads which hinder high speed operation.

This invention provides a pluggable unit which will accommodate the necessary components for a circuit yet isolate and protect the heat sensitive components from the heat producing components while maintaining a relatively small pluggable unit and relatively short circuit leads.

Briefly the invention comprises a plurality of support means in the general shape of an "I" having a web and two flanges. The flanges extend normally to the web beyond the planes of the web on each side. The support means are stacked together on the flanges so the webs are substantially parallel to and spaced from each other. The components are accommodated on each side of the webs with circuit leads connecting the components in the desired circuit to a connector terminal assembly. The connector terminal assembly is attached to the bottom flanges of the package. Heat sensitive components are isolated on a separate web from the heat producing components so a heat sensitive component is never directly confronted by a heat generating component.

It is therefore an objective of this invention to provide an improved pluggable unit which accommodates the necessary circuit heat sensitive and heat producing components in the same pluggable unit, yet isolates the heat sensitive components while maintaining a relatively small pluggable unit and relatively short circuit lead between the components.

Other objects of the invention will be pointed out in the following description and claims and illustrated in the accompanying drawings, which disclose, by way of example, the principle of the invention and the best mode, which has been contemplated, of applying that principle.

Figure 1:
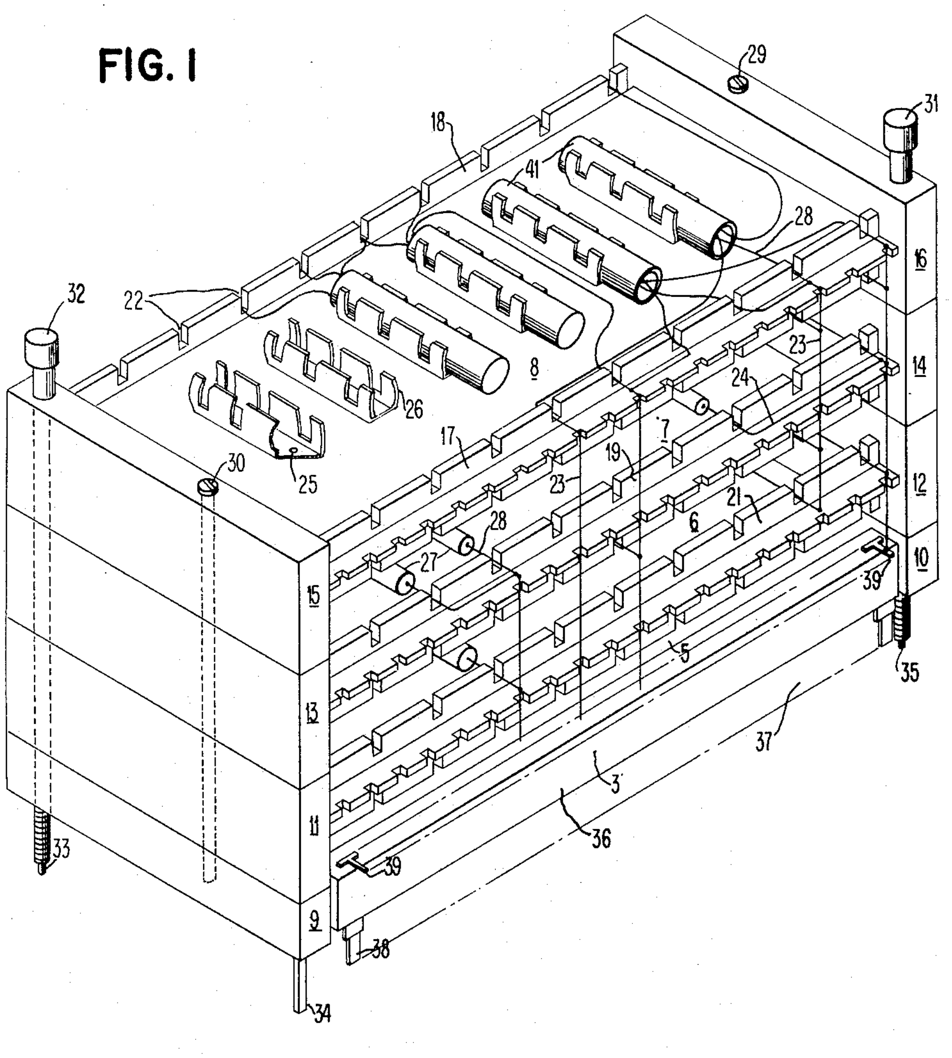
FIG. 1 is an isometric view of a pluggable unit embodying the invention.

Referring first to FIG. 1, the pluggable unit comprises three support plate webs 6–8 with flanges 11–16 attached to the ends of the support plates. A base plate 5 with respective flanges 9—10 is attached to the flanges 11–16 by screws 29 and 30 which screw into flanges 9—10.

Holding strips 17–21 (see also FIGS. 2 and 4) of a resilient electrically insulative material attach to and extend beyond the sides of support plates 6–8. Corresponding recesses 22 hold the leads 28 of electronic components 27 on both sides of the support plates. Transistors 41 are held by clips 26 riveted on support plate 8 by rivets 25.

Connector terminal assembly 36 is attached to base plate 5 comprised of a plurality of electric connectors embedded in an electrically insulative material, such as molded melamine, with the male connectors 38 and terminals 39 exposed. Guide pin 34 and a similar pin not shown extend from opposite corners of flanges 9 and 10 respectively. Freely rotatable screws 33 and 35 screw into female sockets (not shown). Screws 33 and 35 may be easily rotated by knobs 31 and 32.

Figure 2:
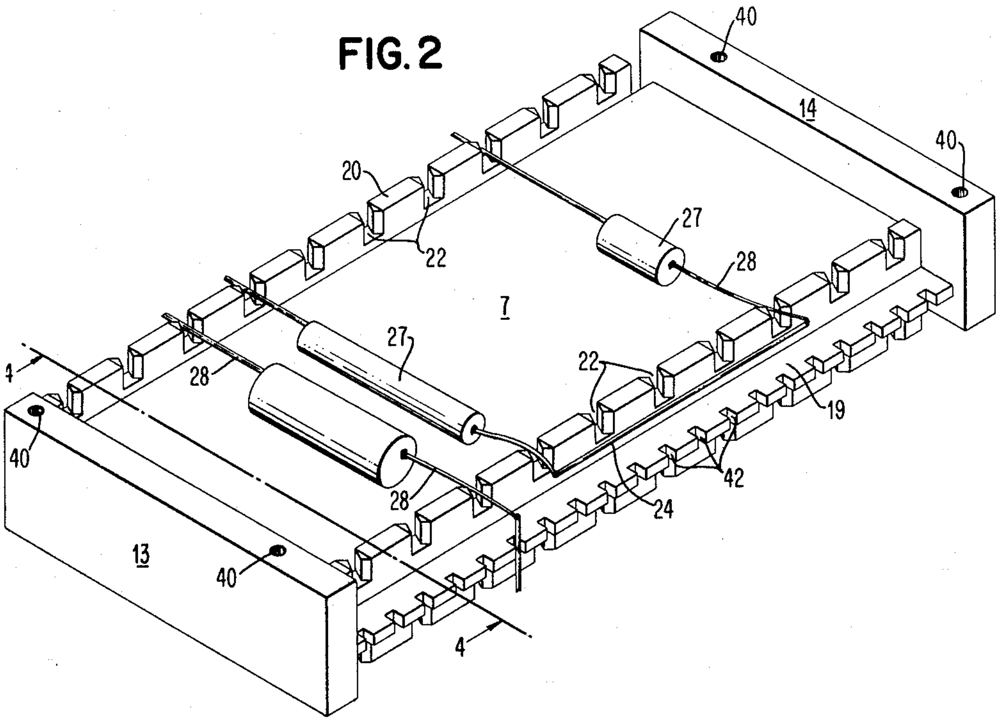
FIG. 2 is an isometric view of one level of the pluggable unit shown in FIG. 1.

Referring now to FIG. 2, a separate support plate web 7 accommodates components 27 by securing their leads 28 in recesses 22. Apertures 40 accommodate screws 29–32 shown in FIG. 1.

Figure 3:
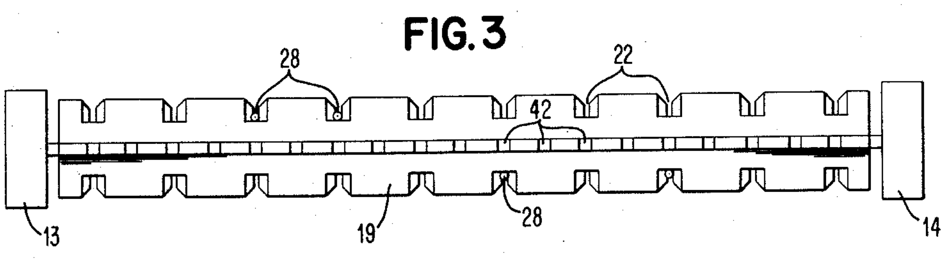
FIG. 3 is a side view of the section shown in FIG. 2.

Referring now to FIG. 3, leads 28 are held in recesses 22 by deforming the resilient material surrounding recesses 22.

Figure 4:
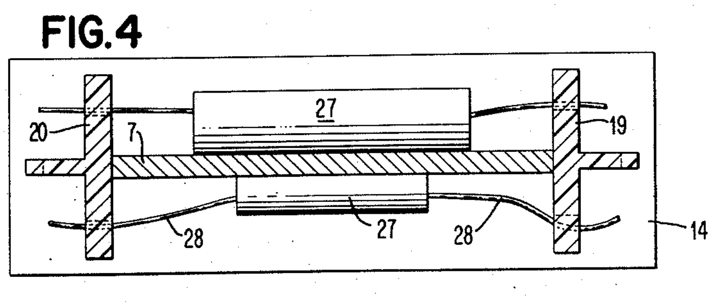
FIG. 4 is a view along lines 4—4 of FIG. 2.

In FIG. 4, support plate web 7 accommodates components 27 on each side of the web by securing leads 28 in holding strips 19 and 20.

After components 27 and transistors 41 have been accommodated on the support plate webs 6–8 and the support plates have been assembled into a pluggable unit as shown in FIG. 1 the leads 28 are connected in a predetermined circuit by horizontal 24 and vertical 23 circuit wires to terminals 39. Leads 28 are cut off close to recesses 22 when the leads are to be connected only by horizontal wires 24 and cut off above guide slots 42 when connected by vertical wires 23. Vertical wires 23 are placed in guide slots 42 while horizontal wires 24 run along the ledge of the holding strip.

Recesses 22 are of a smaller width than the outside diameter of the smallest lead 28 which will be held in recesses 22. Leads 28 are forced into recesses 22 as the resilient material yields to the force yet resumes its shape as the leads 28 are forced to the bottom of recesses 22. Leads 28 are thus held securely in recesses 22 holding the components 27 between the opposite holding strips. The components 27 are usually in contact with the web. If severe vibration or shock is expected the whole package may be potted with a suitable potting material, a process in itself which is well known.

Heat sensitive components such as transistors 41 and diodes are isolated in a space relationship to the heat producing components 27 by placing them on a separate web 8. The heat sensitive component is thus never directly confronted by a heat generating component. The heat generated may be carried away by forcing cool air through the pluggable unit. In the embodiment shown the transistors are placed on the top web 8 for accessibility.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claim.

What is claimed is:

A circuit assembly comprising a plurality of support means, each in the general shape of an "I" having a web and two flanges, said flanges extending normally to the web beyond the planes of the web on each side, said support means stacked on said flanges so said webs are substantially parallel to and spaced from each other, securing means of a resilient electrically insulative material attached to both edges of the web and extending beyond the plane of said web on both sides, a plurality of heat sensitive and heat producing components on each side of said webs, the heat sensitive components on a separate web from the heat producing components so that a heat sensitive component is never directly confronted by a heat generating component, each of said components having at least one electrical lead, said securing means having a plurality of recesses of a smaller inside width than the outside diameter of the leads of said components, said leads extending into and secured in said recesses, connector terminal means attached to the circuit assembly, and circuit means connecting said component leads in a circuit to said connector terminal means.

References Cited in the file of this patent

UNITED STATES PATENTS

| | | |
|---|---|---|
| 2,783,416 | Butler | Feb. 26, 1957 |
| 2,880,378 | Lindseth | Mar. 31, 1959 |
| 2,898,522 | Handen | Aug. 4, 1959 |
| 2,902,630 | Heazel | Sept. 1, 1959 |
| 2,929,964 | Rhys-Jones | Mar. 22, 1960 |

FOREIGN PATENTS

| | | |
|---|---|---|
| 700,517 | Great Britain | Dec. 2, 1953 |
| 803,794 | Great Britain | Nov. 5, 1958 |